United States Patent
Joyner et al.

Patent Number: 5,418,183
Date of Patent: May 23, 1995

[54] METHOD FOR A REFLECTIVE DIGITALLY TUNABLE LASER

[75] Inventors: Charles H. Joyner; Judith P. Meester; Martin Zirngibl, all of Middletown, N.J.

[73] Assignee: AT&T Corp., Murray Hill, N.J.

[21] Appl. No.: 308,248

[22] Filed: Sep. 19, 1994

[51] Int. Cl.$^6$ .......................... H01L 21/20
[52] U.S. Cl. .................. 437/129; 437/133; 148/DIG. 95
[58] Field of Search ............ 437/126, 129, 133; 148/DIG. 95

[56] References Cited

U.S. PATENT DOCUMENTS

| | | | |
|---|---|---|---|
| 4,820,655 | 4/1989 | Noda et al. | 437/129 |
| 4,922,500 | 5/1990 | Chang-Hasnain et al. | 372/50 |
| 5,288,659 | 2/1994 | Koch et al. | 437/129 |
| 5,334,551 | 8/1994 | Komatsu | 437/129 |
| 5,358,896 | 10/1994 | Komatsu et al. | 437/129 |

FOREIGN PATENT DOCUMENTS

| | | | |
|---|---|---|---|
| 411145 | 2/1991 | European Pat. Off. | |
| 77486 | 5/1985 | Japan | 437/129 |

OTHER PUBLICATIONS

Joyner et al., "Extremely Large Band Gap Shifts for MQW Structures by Selective Epitaxy on $SiO_2$ Masked Substrates," IEE Phot. Tech. Letts. 4(9), (Sep. 1992), pp. 1007–1009.

Eckel et al., "Improved Composition Homogeneity During Selective Area Epitaxy of GaInAs Using a Novel In Precursor," Appl. Phys. Letts., 64(7), (Feb. 1994), pp. 854–856.

Kato et al., "DFB-LD/Modulator Integrated Light Source by Bandgap Energy Controlled Selective MOVPE," Elect. Letts. 28(2), (Jan. 1992), pp. 153–154.

Aoki et al., "InGaAs/InGaAsP MQW Electroabsorption-Modulator Integrated with a DFB-Laser Fabricated by Bandgap Energy Control Selective Area MOCVD," Prepublication copy, (Sep. 1994).

Thrush et al., "Selective and Non-Planar Epitaxy of InP, GaInS and GaInAsP Using Low Pressure MOCVD," J. Cryst. Growth, v. 124, (1992), pp. 249–254.

Caneau et al., "Selective Organometallic Vapor Phase Epitaxy of Ga and In Compounds: A Comparison of TMIn and TEGa versus TMIn and TMGa," J. Cryst. Growth, v. 132, (1993), pp. 364–370.

Zirngibl et al., "Digitally Tunable Laser Based on Integration of Waveguide Grating Multiplexer and Optical Amplifier," Elect. Letts., v. 30, (Sep. 1994), p. 701.

*Primary Examiner*—R. Bruce Breneman
*Assistant Examiner*—Linda J. Fleck

[57] ABSTRACT

A method for forming a reflective digitally tunable laser using selective area epitaxy is disclosed. The laser comprises passive waveguides and a plurality of optical amplifiers. The waveguides and optical amplifiers are formed by depositing multiple quantum wells having a suitable bandgap. According to the method, the multiple quantum wells forming both the passive waveguides and the optical amplifiers are deposited simultaneously using a dielectric mask. The mask comprises dual, rectangularly-shaped strips of dielectric material, spaced to form a gap. The multiple quantum wells grown in the gap are suitable for use as optical amplifiers, and those grown outside of the gap are suitable for use as passive waveguides.

13 Claims, 8 Drawing Sheets

METHOD FOR A REFLECTIVE DIGITALLY TUNABLE LASER

CROSS REFERENCE TO RELATED APPLICATION

This invention is related to application Ser. No. 08/152,603 [Kaminow 45-6] of Ivan Kaminow and Martin Zirngibl, entitled "Reflective Digitally Tunable Laser".

FIELD OF THE INVENTION

This invention relates to an epitaxial growth method for forming a laser, and more particularly to using selective area epitaxy to form a reflective digitally tunable laser.

BACKGROUND OF THE INVENTION

Photonic integrated circuits are typically comprised of a plurality of photonic devices, located on a semiconductor substrate, that are in optical communication with one another. Most methods for creating photonic integrated circuits involve forming one photonic device at a time. This is due to an inability to regionally vary the bandgap of the quantum well (QW) material being deposited in a given epitaxial growth.

In the methods noted above, the epitaxial layers required to form a first type of photonic device, such as a laser, are grown over the whole substrate. The temperature, pressure and source materials used for the growth are selected so that the quantum well (QW) material that is deposited has the requisite characteristics, i.e., band gap, to function as the desired device. The layers are then masked at the region where the first photonic device is desired. Subsequently, the layers in unprotected regions are etched away where other devices, such as modulators or waveguides, are desired. After etching, layers corresponding to a second type of photonic device are grown on the substrate in the etched regions. Growth conditions are adjusted for the second growth so that the QW material exhibits the appropriate band gap. If a third type of photonic device is desired, the layers are again masked and etched, conditions are adjusted and a third series of epitaxial layers are grown in the etched region.

Methods that utilize successive growths as described above may collectively be referred to as "etch and regrow" methods. Devices grown from the etch and regrow method frequently exhibit poor optical interface quality, which can result in internal reflections and coupling losses.

Selective area epitaxy (SAE) is an epitaxial growth method that minimizes the poor optical interface problems associated with the etch and regrow method. Using SAE, the bandgap of QW material can be varied in the same plane with a single growth. Thus, layers defining various photonic devices can be grown simultaneously. See Joyner et al., "Extremely Large Band Gap Shifts for MQW Structures by Selective Epitaxy on SiO₂ Masked Substrates," IEEE Phot. Tech. Lett., Vol. 4, No. 9 (September 1992) at 1006–09 and Caneau et al., "Selective Organometallic Vapor Phase Epitaxy of Ga and In Compounds: A Comparison of TMIn and TEGa versus TMIn and TMGa," J. Crystal Growth, Vol. 132 (1993) at 364–70.

In the SAE method, dielectric masks, such as $SiO_x$ or $SiN_x$, are deposited on a substrate. Such masks typically comprise two strips of dielectric material, spaced to form a gap. Source material for forming the epitaxial layers, such as indium (In), gallium (Ga), arsenic (As), and phosphorus (P), is typically delivered via metalorganic vapor phase epitaxial (MOVPE) methods.

Source material arriving from the vapor phase will grow epitaxially in regions where the mask is open, i.e, the substrate is uncovered. Source material landing on the mask itself will not readily nucleate. Given the proper temperature and mask width, most of the source material that lands on the mask reenters the vapor phase and diffuses, due to the local concentration gradient, to find an unmasked region.

Compared to a completely unmasked substrate, the QW growth that occurs in the gap for both InGaAs and InGaAsP epilayers will be thicker, and richer in indium. This effect is due to the relative diffusion coefficients of In and Ga under typical MOVPE growth conditions. As the QW layers thicken, changes occur in the quantum confined Stark effect resulting in longer wavelength (lower energy band gap) QW material. Increasing indium content also results in longer wavelength QW material. Thus, from both the quantum-size effect and change in alloy composition, the QWs in the gap are shifted to lower energy band gaps than regions far from the mask. By varying the ratio of the mask width to the gap (width), the composition, and hence the bandgap, of QW material can be varied.

SUMMARY OF THE INVENTION

A method is disclosed for forming a reflective digitally tunable laser wherein the QW material for forming the passive waveguides as well as the optically active regions are deposited in a single QW growth step using SAE. The method uses masks comprising dual, rectangularly-shaped strips of dielectric material, spaced to form a gap. Mask and gap size is varied so that the QW material deposited in the gap has a bandgap suitable for use as an optical amplifier, while QW material deposited at other regions has a bandgap suitable for use as waveguiding material.

BRIEF DESCRIPTION OF THE DRAWINGS

Other features of the present invention will be more readily understood from the following detailed description of specific embodiments thereof when read in conjunction with the accompanying figures in which.

DETAILED DESCRIPTION

Figure 1:
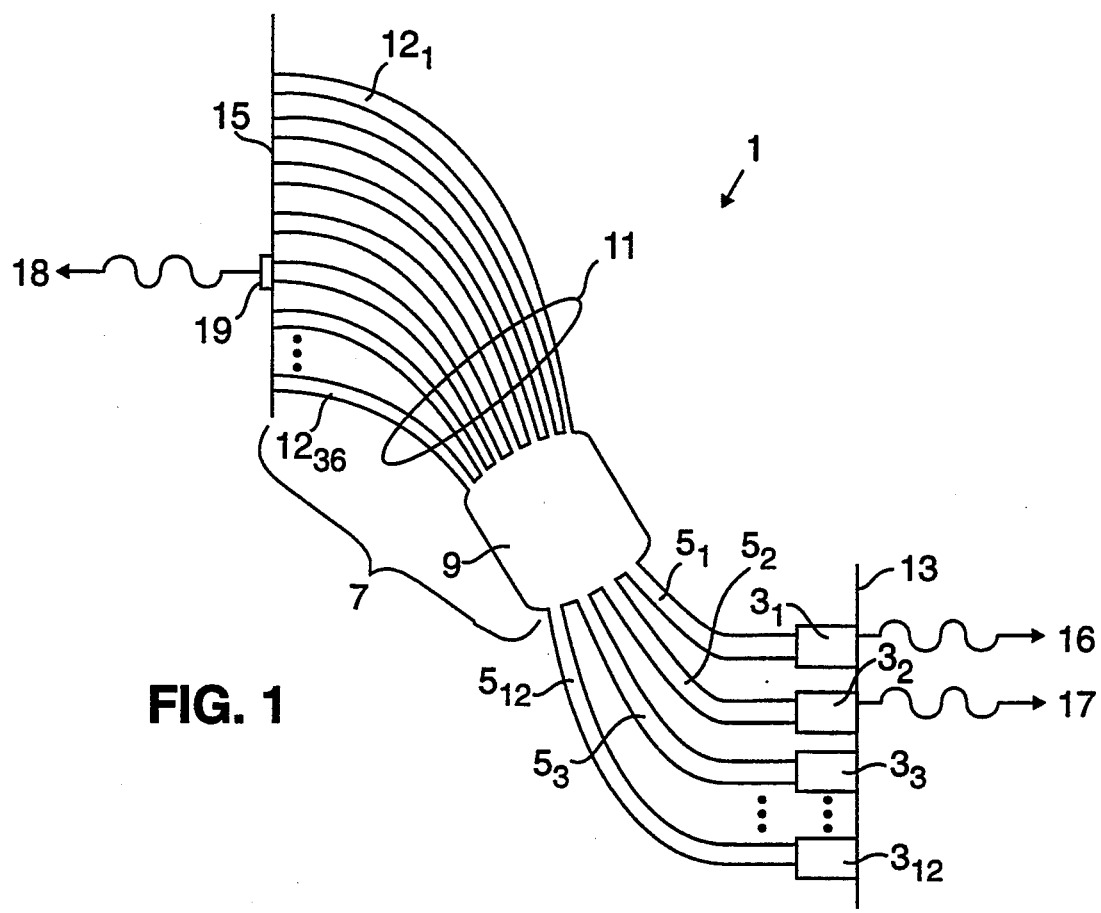
FIG. 1 is a schematic diagram of a digital laser.

A schematic of a reflective digitally tunable laser 1 is shown in FIG. 1. The reflective digitally tunable laser 1 is described in Ser. No. 08/152,603, the specification of which is incorporated by reference herein in its entirety. The laser 1 comprises a plurality of optically active sections $3_{1-N}$, also referred to as optical amplifiers, for providing optical amplification, a plurality of waveguides $5_{1-N}$, and a wavelength selective device 7 for providing wavelength selectivity. The wavelength selective device 7 comprises a free space region 9 for expansion of an optical signal from one of the waveguides $5_{1-N}$, and a waveguide grating 11 comprised of a plurality of waveguides or grating arms $12_{1-M}$. Each grating arm has a different length than all other grating arms. The laser 1 further includes two cleaved facets or surfaces 13 and 15 that function as high reflection mirrors defining a cavity in which lasing action can be supported.

The optical amplifiers $3_{1-N}$ connect one end of the waveguides $5_{1-N}$ to the first cleaved surface 13. There is preferably a one-to-one correspondence between the number of waveguides $5_{1-N}$ and the number of optical amplifiers $3_{1-N}$. The waveguides $5_{1-N}$ are connected, at their other end, to the free space region 9. The free space region 9 is also connected to the grating arms $12_{1-M}$ which form the grating 11. As mentioned above, the grating 11 and the free space region 9 comprise the wavelength selective device 7. The grating 11 terminates at the second cleaved surface 15. Selectively applying electrical energy to one of the optical amplifiers $3_{1-N}$ will create a specific transparent route for lasing action between the mirrors 13, 15. The route supports the propagation of light of a specific wavelength. The operation of the laser is described more fully in Ser. No. 08/152,603.

While the laser shown in FIG. 1 has twelve optically active sections $3_{1-N}$, twelve waveguides $5_{1-N}$, and thirty six grating arms $12_{1-M}$, it should be understood that the reflective digitally tunable laser 1 is not limited to this particular configuration. Other configurations having a different number of optically active sections $3_{1-N}$, waveguides $5_{1-N}$ and grating arms $12_{1-M}$ are acceptable. There are, however, typically more grating arms $12_{1-M}$ in the grating 11 than waveguides $5_{1-N}$. The ratio of M to N is usually about 3. As used herein, the terms passive waveguides, passive waveguiding region and ribs refer to the waveguides $5_{1-N}$ and the wavelength selective device 7.

Figure 2:
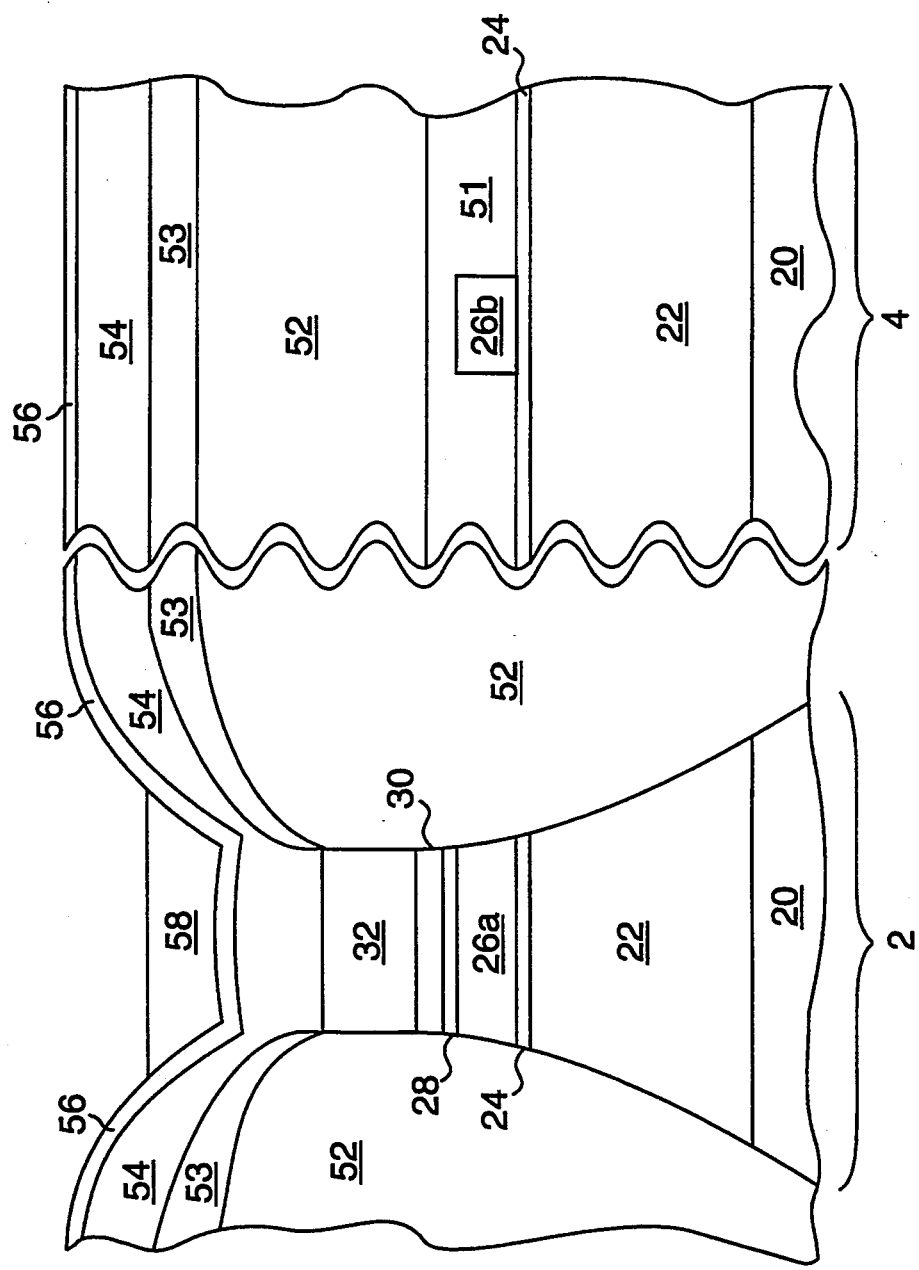
FIG. 2 is a cross section through a digital laser formed according to the present invention.

A cross section of the laser 1 is shown in FIG. 2. A left portion of FIG. 2 shows a cross section of an exemplary embodiment of the optical amplifiers $3_{1-N}$. A right portion shows a cross section of an exemplary embodiment of the passive waveguiding region. The laser 1 may be grown using SAE.

Figure 3A:
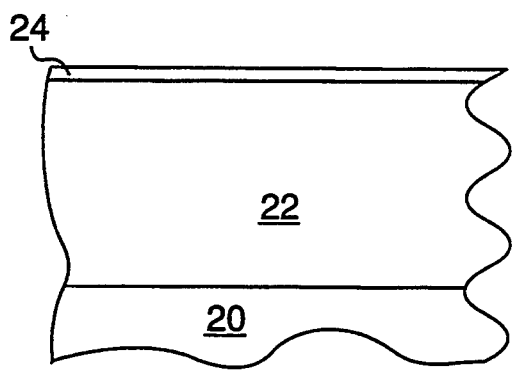
FIGS. 3a–3h illustrate various stages in the fabrication of a digital laser according to the present invention.

In one embodiment of the present invention, the laser 1 may be formed in six primary steps as described below. In the first step, illustrated in FIG. 3a, a guiding layer 22 of indium-gallium-arsenide-phosphide (InGaAsP) is deposited on a substrate 20 using MOVPE. The guiding layer 22 provides waveguiding in the vertical direction. The guiding layer 22 forms a continuously graded region to cover a 1.0 to 1.4 micrometer bandgap, preferably a 1.1 to 1.35 micrometer bandgap.

A bulk homogenous layer of proper thickness and refractive index would also be suitable for the guiding layer 22. The substrate 20 may be any material or compound suitable for laser growth, including, without limitation, indium phosphide (InP) or gallium arsenide (GaAs). As will be appreciated by those skilled in the art, other suitable deposition techniques including but not limited to molecular beam epitaxy (MBE) or metal organic molecular beam epitaxy (MOMBE) may be used for the various growth steps according to the present invention.

A layer 24, which functions as a rib spacer, is deposited on top of the guiding layer 22. The layer 24 dictates the mode confinement factor of the waveguide. The layer 24 is preferably about 75 to 225 angstroms thick and may be any alloy composition having a lower refractive index than guiding layer 22 and the ribs 46, discussed below. Preferably, the layer 24 is formed from undoped InP.

Figure 3B:
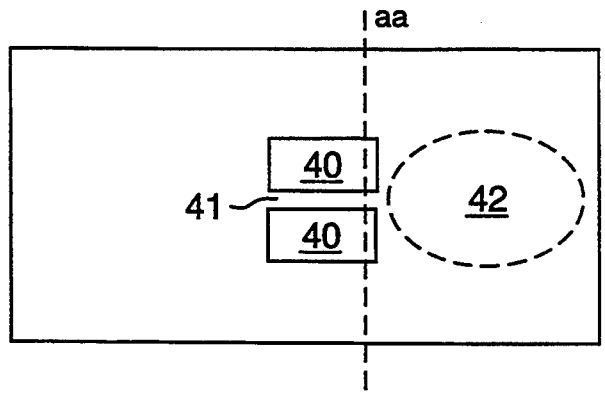
Figure 3C:
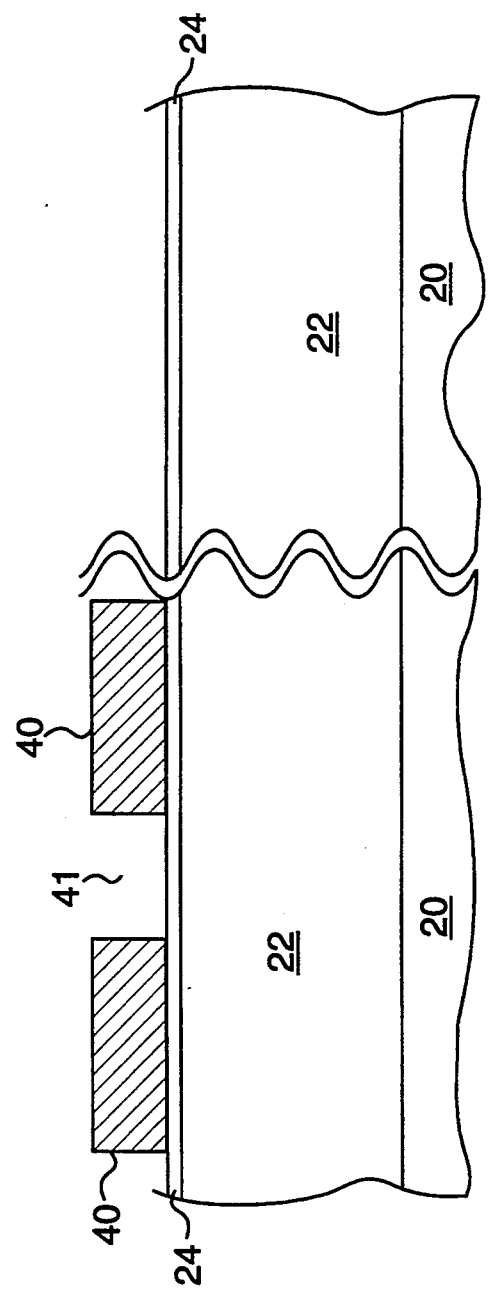

FIGS. 3b and 3c illustrate the second step of forming the laser 1. FIG. 3b is a top view, and FIG. 3c is a cross-sectional view from line aa in FIG. 3b. It should be understood that in the cross sections shown in FIGS. 3c–3h, the passive waveguiding region (which is shown on the right side of those figures) is actually located in front of the optical amplifier $3_{1-N}$, occupying the region designated 42 in FIG. 3b. Only the multiquantum well (MQW) material deposited in the region 42 will be patterned, as discussed below, into the passive waveguides.

In the second step, a mask 40 is deposited on the layer 24 where the optical amplifier 3 will be formed. The mask is preferably formed of dielectric material, including, without limitation, $SiO_x$ and $SiN_x$. Preferably, the mask is formed from $SiO_2$. The mask 40 can be made by any suitable method such as, without limitation, plasma-assisted chemical vapor deposition, electron beam vaporization or sputtering.

The material that will patterned into the mask 40 is deposited to a thickness of about 3000 angstroms and then etched to create the desired mask configuration. The thickness of the mask 40 should be about equal to the wavelength of the light used to expose the photoresist during photolithographic patterning. This results in an improvement in mask features, i.e., sharp edges, relative to other thicknesses.

Figure 3D:
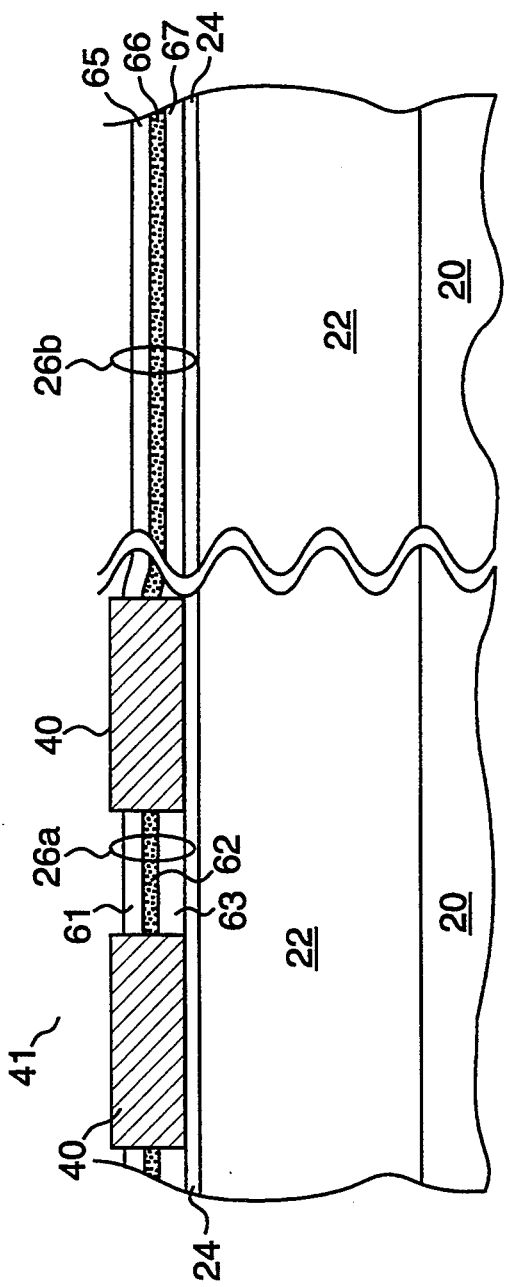

In the embodiment shown in FIGS. 3b–3d, the mask 40 comprises a pair of dielectric rectangles that are spaced to form a gap 41. The width of the two strips forming the mask 40, and the gap 41 must be sized so that the MQW material grown in the gap is suitable for forming the optically active regions $3_{1-N}$, i.e., has a bandgap wavelength of approximately 1.4–1.6 micrometers, preferably 1.55 micrometers. A width of forty micrometers for the strips forming the mask 40, and a gap 41 of fifteen micrometers between the strips has been found to be suitable for growing MQWs having such a band gap. Other mask geometries and spacings may be used to form a mask 40 suitable for depositing QW material having a band gap suitable for forming an optical amplifier. See Joyner et al., "Extremely Large Band Gap Shifts for MQW Structures by Selective Epitaxy on $SiO_2$ Masked Substrates," IEEE Photo. Tech. Letts., 4(9), (September 1992) at 1006–09. This and all other articles mentioned in this specification are incorporated herein by reference.

In areas outside of the mask 40, i.e., outside of the gap 41, the MQW material has a bandgap wavelength of approximately 1.0–1.4 micrometers, preferably 1.35 micrometers, which is suitable for forming the passive waveguides of the laser 1.

There is a transition region between the nominally 1.55 band gap QW material and 1.35 band gap QW material. This transition region extends a distance of about 1.5 times the gap width moving away from the mask 40 parallel to the gap 41. This region may need to be pumped into transparency. In cases where back reflections are a problem, the transition region may serve as an absorption buffer if power budgets permit.

After depositing the masks, the MQW stacks are grown using SAE. The MQW stacks 26a and 26b comprise a plurality of QW layers. Each QW layer of the stack is separated by a barrier layer. In the exemplary embodiment shown in FIG. 3d, the MQW stack 26a includes barrier layer 63, QW layer 62 and barrier layer 61. As will be appreciated by those skilled in the art, many parameters will influence the characteristics of the QW material. It is well known in the art how to vary such parameters to grow QW material adapted for a particular application. For the laser 1, which is adapted for communications applications, the QWs should be tailored to achieve an appropriate compromise between output power, quantum efficiency and bandwidth characteristics. Typically about three to ten QW layers, and corresponding barrier layers, are present in MQW stacks adapted for optical amplification. In a preferred embodiment, the MQW stack 26a comprises five QW layers.

The MQW stack 26b includes barrier layer 67, QW layer 66 and barrier layer 65. Each QW layer of the MQW stack 26b should be tailored to maximize optical confinement and provide low loss. Regarding the low loss, free carrier absorption characteristics, scattering and other loss mechanisms should be considered.

As illustrated in FIG. 3d, the QWs grown in the gap 41 are thicker than those grown outside of it. In addition, the QWs grown in the gap 41 have a higher indium content. This difference in thickness and indium content results in a difference in bandgap energy, and hence, function.

Two heterostructure confinement layers, not shown in the drawings, may also be deposited to improve mode confinement of the optical amplifier $3_{1-N}$. To this end, one heterostructure confinement layer should be deposited directly below and above the MQW stack 26a.

Figure 3E:
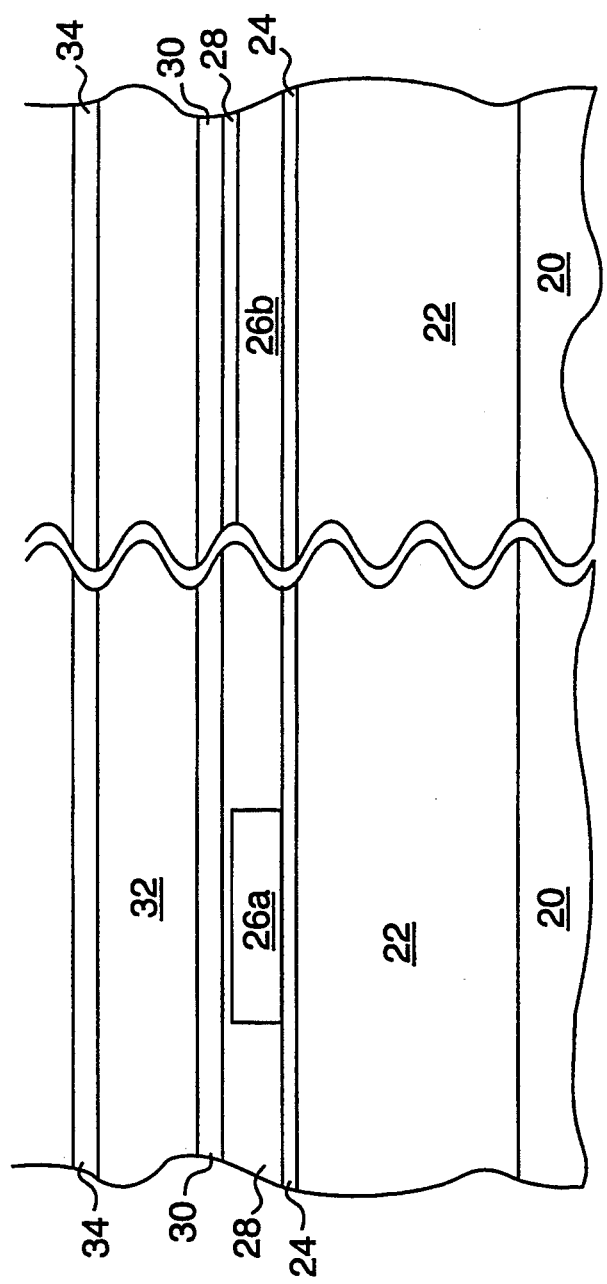

Prior to the third growth depicted in FIG. 3e, the mask 40 is etched away using a suitable etchant such as HF or gas phase chemical etching.

In the third step, a stop-etch layer 28 is deposited on the MQW stacks 26a and 26b. This layer, which should be about 75 to 225 angstroms thick, is lightly P-doped (about $5 \times 10^{15}/cm^3$) InP. A layer 30 is then deposited on layer 28. The layer 30 functions as an etch mask to aid, in subsequent etch steps, in sharply defining the passive waveguides of the laser 1. Layer 30, which should be about 150 to 450 angstroms thick, is formed of InGaAsP having a bandgap wavelength of about 1.35 micrometers.

Next, a layer 32 is deposited on the layer 30 to insure that the MQW stack 26a is sufficiently buried in a semi-insulating layer 52, discussed below. The layer 32 also provides lithographic precision in defining the width of the optical amplifier 3. The layer 32 is about 300 to 900 angstroms thick and is formed of lightly P-doped InP. The layer 32 is followed by a cap layer 34 to prevent undercut in subsequent etch steps. The cap layer 34 has a thickness of about 150 to 450 angstroms and is formed of InGaAsP.

Figure 3F:
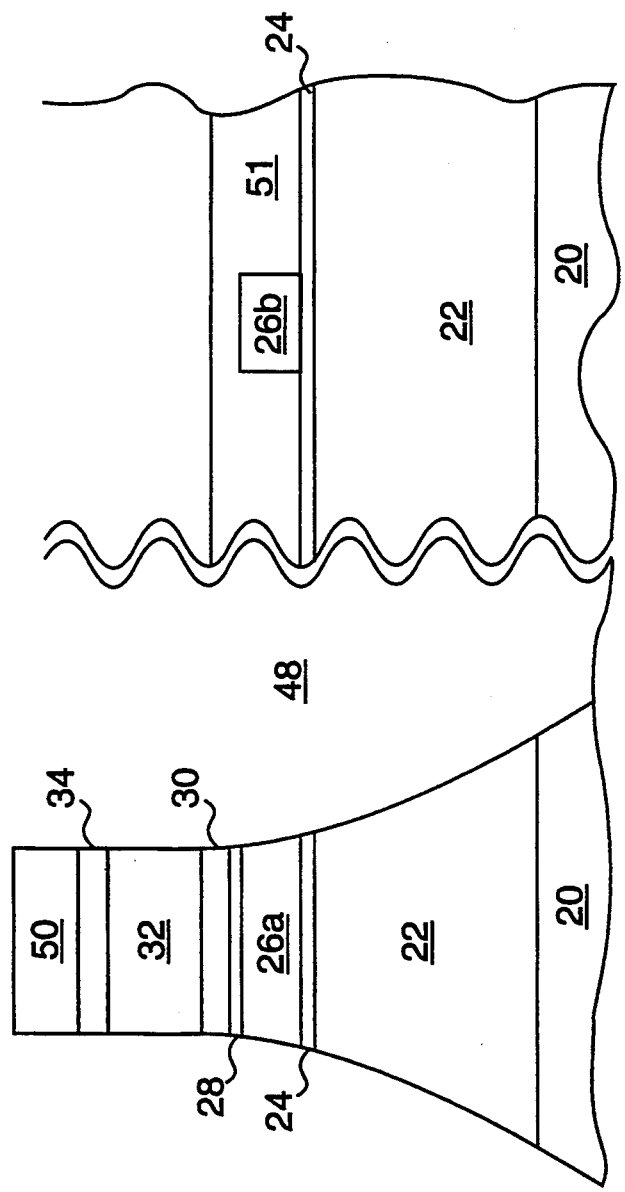

Next, the various layers 28, 30, 32 and 34 that cover the MQW stack 26b are removed, and the wafer undergoes a series of mask and etch steps to pattern the MQW stack 26b in the waveguiding region into ribs 46, as shown on the right side of FIG. 3f. These ribs, which should be about 2 to 4 micrometers in width, provide index loading for the underlying slab waveguide 22. The ribs are patterned as shown in FIG. 1 to form the passive waveguides that define the optically preferred paths of the laser 1. After the ribs 46 are patterned, the optical amplifier section 2 is protected with a stripe 50 of suitable material, such as $SiO_2$.

In step 4, a layer 51 of undoped InP, shown in FIG. 3f, is deposited. The layer 51 decreases the signal loss associated with a current blocking layer 52 that will be deposited next. The passive waveguiding region 4 is then protected with suitable material, such as $SiO_2$ and photoresist, which is deposited on layer 51 in preparation for defining the optical amplifiers $3_{1-N}$.

The left side of FIG. 3f shows the optical amplifier 3 patterned into a mesa. The stripe 50 that was deposited on top of the cap layer 34 acts as a mask while the layers in the optical amplifier region 2 are patterned by a suitable etch into the mesa shape shown in FIG. 3f. The mesa is preferably about 2 to 4 micrometers high above the bottom of the channel 48 produced by the etch step. Following the etch, the layer 51 is uncovered so that the wafer is delivered for the fifth growth step as shown in FIG. 3f with the mesa top covered by the stripe 50.

Figure 3G:
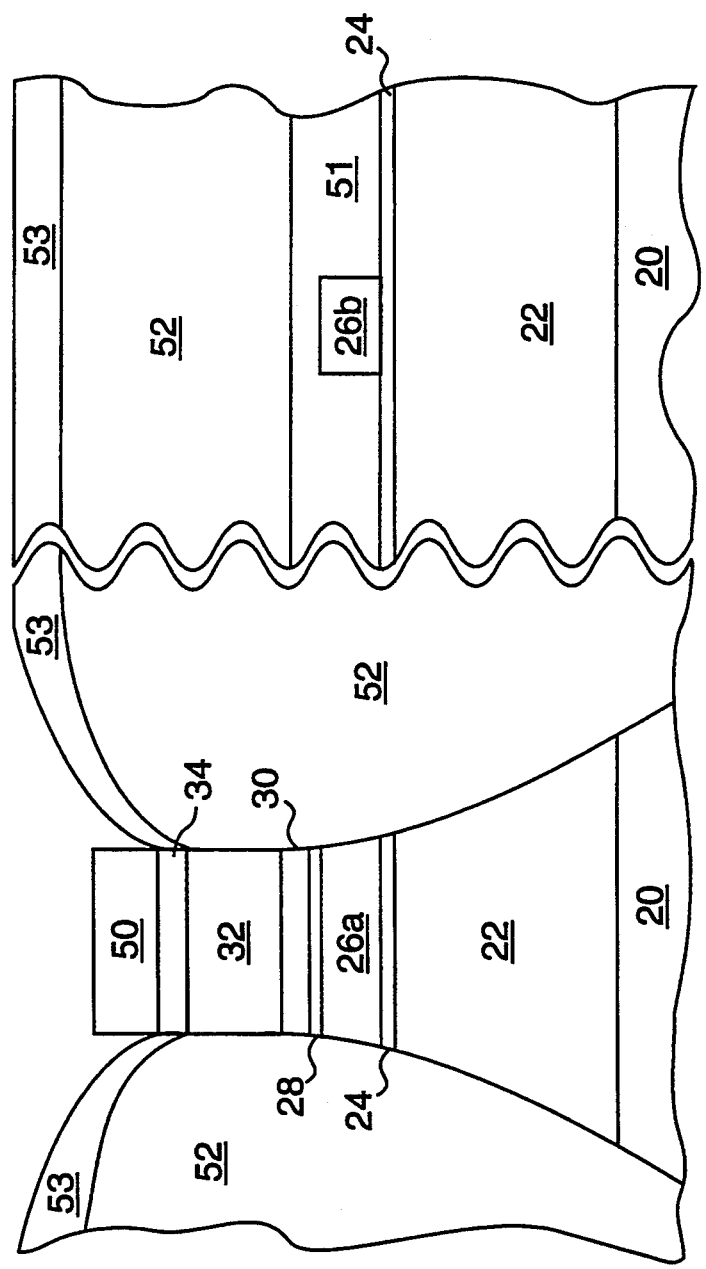

The wafer at the end of the fifth growth step is shown in FIG. 3g. A current blocking layer 52 is grown over all exposed surfaces shown in FIG. 3f. This provides current blocking for the optical amplifier 3 and buries the passive waveguides. Current blocking may be achieved by a buried structure such as a reverse biased P-N junction. The current blocking layer is preferably formed of Fe doped InP. Next, a barrier layer 53 of N-type InP is deposited on the current blocking layer 52. The barrier layer 53 minimizes zinc (P dopant) migration from the layer 54, discussed below, to the layer 52, and iron migration from the layer 52 to the layer 54. The stripe 50 and the underlying cap layer 34 are then removed from the top of the mesa prior to the last growth step.

Figure 3H:
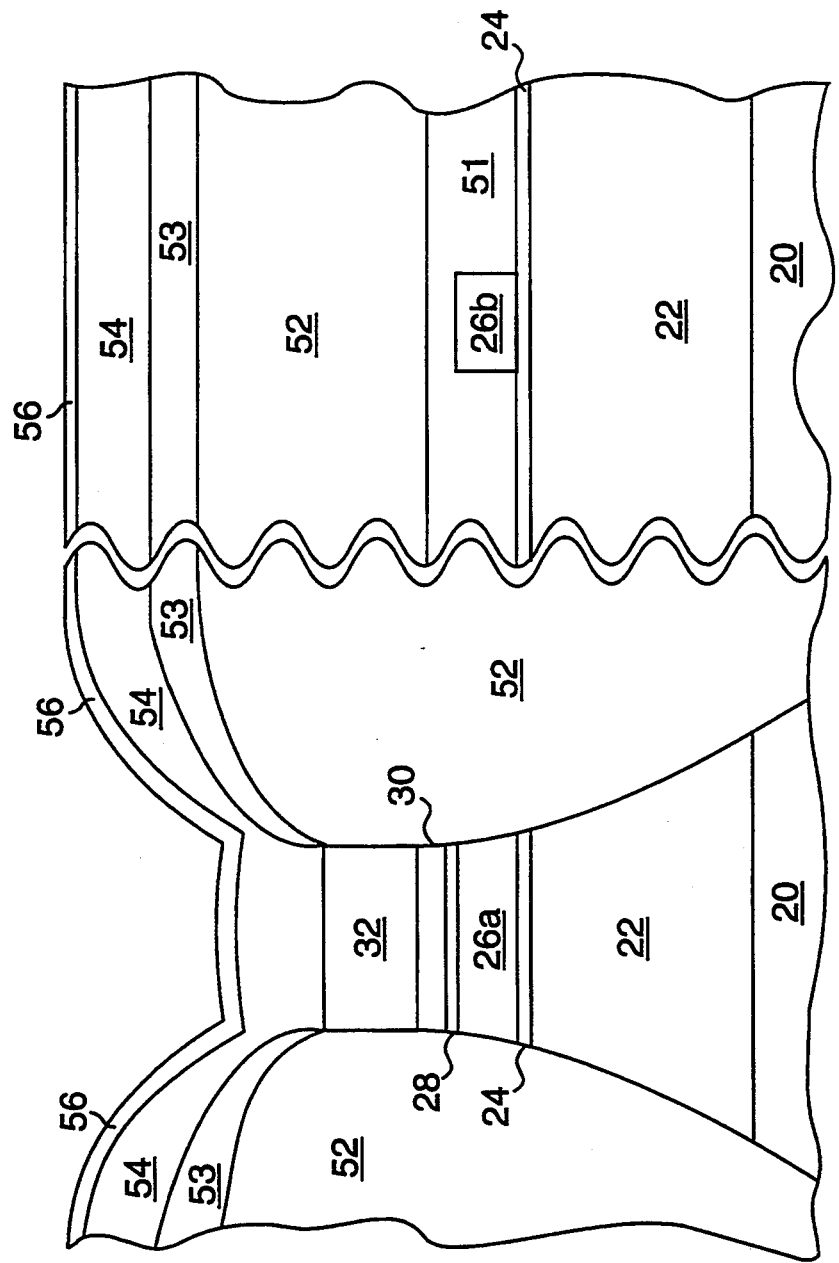

In the sixth growth step, depicted in FIG. 3h, a layer 54 is grown over all surfaces to complete the P-contact layer and provide separation of the optical mode from the metal contact subsequently deposited. The layer 54 is followed by a layer 56 for depositing a ohmic contact, which is preferably a metal such as gold or a gold alloy. The layer 54 is preferably heavily P-doped InP (about $2 \times 10^{18}/cm^3$) and the layer 56 is preferably even more heavily P- doped InGaAsP (about $5 \times 10^{18}/cm^3$).

The contact 58 is deposited and the facets 13, 15, shown in FIG. 1, are cleaved. In a preferred embodiment, the facets 13, 15 may be appropriately coated so that the facet 13 is substantially totally reflective and the facet 15 is partially 15 transmissive, so that light is emitted by the device 1 at facet 15. In a most preferred embodiment, a single output port 18 is provided for light of any wavelength at facet 15. In this case, the facets 13 and 15 are highly reflective except at the output port 18 which is associated with one of the grating arms 12. At the output port 18, the facet 15 is coated with an anti-reflection material 19 so that it is substantially transmissive. There is presently no preference as to which grating arm is selected for location of the output port 18.

In a preferred embodiment of the present invention, the MQW stacks 26a and 26b are incorporated in the middle of the guiding layer 22, where the optical mode is most intense. When about one-half of the desired thickness of the guiding layer is deposited, masks 40 are formed and MQW material is deposited. The masks are then removed and the balance of the guiding layer 22 is deposited. As will be appreciated by those skilled in the art, this embodiment requires altering the relative thickness of some of the layers and further entails using a quaternary layer having a band gap wavelength of about 1.3 micrometers to replace the MQW stack 26b forming the rib 46.

While a method for forming one optical amplifier $3_{1-N}$ is described above, it should be understood that a plurality of such optical amplifiers $3_{1-N}$ and associated waveguides $5_{1-N}$ may be formed according to the present invention. In such a case, a plurality of masks 40 would be used to grow a plurality of MQW stacks of suitable bandgap for forming an optical amplifier $3_{1-N}$ at a plurality of locations on a substrate.

As described in Ser. No. 08/152,603, the reflective digitally tunable laser may be formed by cleaving the laser disclosed in U.S. Pat. No. 5,373,517 herein incorporated by reference, in half. The wavelength selective device used in the laser described in U.S. Pat. No. 5,373,517 may be characterized as a transmissive device, as opposed to the wavelength selective device described herein which is characterized as a reflective device.

The transmissive device includes two free space regions connected by an optical grating composed of unequal length waveguides. Each free space region is also connected to another plurality of waveguides, equivalent to the waveguides $5_{1-N}$ of the present application. Each of these other plurality of waveguides contain optical amplifiers. The optical amplifiers connect these waveguides, located at each end of the transmissive device, to a cleaved facet formed in a wafer on which the aforementioned elements are formed. The two cleaved facets comprise mirrors defining a cavity in which lasing action can be supported.

A line of symmetry exists through the optical grating of the transmissive device. This line runs perpendicular to the waveguides forming the grating. Cleaving the transmissive device at the line of symmetry yields two mirror image reflective devices.

It should be recognized that the same growth steps used for forming the laser of the present invention may be used to form a laser based on the transmissive wavelength selective device. In fact, once a laser based on the transmissive device is formed, it may be cleaved at the line of symmetry to form two reflective digitally tunable lasers of the present invention.

EXAMPLE

An embodiment of the laser 1 was formed according to the present invention. The entire device was fabricated in the six primary steps described above. The source materials were deposited using MOVPE at 100 torr and 615° C. Ethyldimethylindium (10° C.), trimethylgallium (−11° C.), 100 percent arsine and 100 percent phosphine were used as the source materials. The substrate was 2 inch <100> oriented indium phosphide (InP), heavily S doped at about $10^{18}/cm^3$.

First, a 4000 angstrom thick guiding layer of InGaAsP having a bandgap wavelength varying from 1.1 to 1.35 micrometers was deposited on the substrate. Next, a layer of undoped InP about 150 angstroms thick was deposited on the guiding layer.

In step 2, twelve $SiO_2$ masks were deposited on the undoped InP layer at the desired location for the optical amplifiers. The $SiO_2$ was deposited to a thickness of about 3000 angstroms and then wet etched through baked photoresist masks using buffered HF to created the desired mask configuration. Each mask comprised a pair of $SiO_2$ rectangles, each 40 micrometers in width and spaced from one another by 15 micrometers.

The MQW stacks were grown using SAE. The InGaAsP QW layers in the optically active region were 95 angstroms thick. The InGaAsP barrier layers were 173 angstroms thick. The InGaAsP QW layers in the passive waveguiding region were 50 angstroms thick and the InGaAsP barrier layers were 65 angstroms thick. Five QW layers were grown in both the optically active regions and the passive waveguiding regions.

After depositing the MQW stacks, the masks were etched away using HF.

In the third step, a 150 angstrom thick layer of lightly n-type (about $5 \times 10^{15}/cm^3$) InP was deposited on the MQW stacks. A 300 angstrom thick layer of InGaAsP having a bandgap wavelength of about 1.35 micrometers was then deposited on the InP layer. A layer of lightly Zn doped InP, about 6000 angstroms thick, was deposited on the InGaAsP layer. Next, a 300 angstroms thick cap layer of InGaAsP was deposited on the InP layer.

Next, the MQW stacks in the passive waveguiding regions were uncovered and patterned into 2 to 4 micrometer wide ribs. After the ribs 46 are patterned, the optical amplifier regions were protected with $SiO_2$.

In the fourth growth, a 3000 angstrom layer of undoped InP was deposited. The passive waveguiding regions were then protected with $SiO_2$ and photoresist. Next, the optical amplifier regions were patterned into mesas using a wet chemical HBr etch. The waveguides were then uncovered.

In the fifth step, a Fe doped InP current blocking layer two microns thick was deposited over all exposed surfaces. Next, a 1000 angstrom layer of lightly n-doped InP was deposited. The strips of $SiO_2$, and the cap layer of InGaAsP were removed in preparation for the last growth.

In the sixth and final growth, a layer of heavily Zn doped InP ($2 \times 10^{18}/cm^3$) was deposited over all surfaces, followed by a layer of more heavily Zn doped InGaAsP ($5 \times 10^{18}/cm^3$). Gold contacts were deposited over each optical amplifier and the wafer was cleaved at two locations to define the laser cavity.

It should be understood that the embodiments described herein are illustrative of the principles of this invention and that various modifications may occur to, and be implemented by those skilled in the art without departing from the scope and spirit of the invention. For example, the quantum layers for other devices, such as modulators, could be deposited in the same QW growth step in which the optical amplifiers and passive waveguides are deposited. Thus, the method of the present invention for forming a reflective digitally tunable laser can be used to form a variety of photonic integrated circuits.

We claim:

1. A method for forming a tunable laser on a semiconductor substrate, comprising:
   (a) depositing, in a single growth, a first type of multiquantum well material suitable for forming passive waveguides and a second type of multiquantum well material suitable for forming optical amplifiers;
   (b) patterning the first type of multiquantum well material deposited in step (a) into:
      (i) a wavelength selective device having a free space region and a plurality of waveguides, each waveguide having a different length, the plurality of waveguides collectively defining an optical grating that is connected at one end to the free space region and
      (ii) a plurality of input waveguides which connect to the free space region; and
      patterning the second type of multiquantum well material deposited in step (a) into at least two controllable optical amplifiers in at least two of the waveguides of the plurality of input waveguides;

(c) cleaving the semiconductor substrate at two spaced locations to form a first and second facet mirror, where the first facet mirror is connected to the wavelength selective device by the input waveguides containing the optical amplifiers and the second facet mirror is connected to the plurality of waveguides defining the optical grating; and (d) depositing at least two electrodes, one for each controllable optical amplifier, where each electrode is in electrical contact with one controllable optical amplifier so that a bias current can be selectively provided to any one of the at least two controllable optical amplifiers.

2. The method of claim 1 wherein the step of depositing, in a single growth, a first and second type of multiquantum well material further comprises depositing at least two masks, each mask comprising two dielectric strips spaced to form a gap, wherein the mask causes the first type of multiquantum well material to deposit outside the gap, and the second type of multiquantum well material to deposit in the gap.

3. The method of claim 2 wherein the dielectric strips are formed from material selected from the group consisting of $SiO_x$ and $SiN_x$.

4. The method of claim 2 wherein the gap is 15 micrometers wide and each of the strips forming the mask is 40 micrometers wide.

5. The method of claim 1 wherein the first and second type of multiquantum well material is the quaternary compound InGaAsP.

6. The method of claim 1 wherein the first type of multiquantum well material has a bandgap wavelength of about 1.0 to 1.4 micrometers, and the second type of multiquantum well material has a bandgap wavelength of about 1.4 to 1.6 micrometers.

7. The method of claim 1 wherein the first type of multiquantum well material has a bandgap wavelength of about 1.35 and the second type of multiquantum well material has a bandgap wavelength of about 1.55 micrometers.

8. The method of claim 1 wherein the first and second type of multiquantum well material is deposited using organo metallic vapor phase epitaxy at 100 torr and 615° C.

9. The method of claim 1 wherein the substrate is $<100>$ oriented InP, S doped at $10^{18}/cm^3$.

10. The method of claim 1 further comprising coating the second facet mirror with a material so that it is partially transmissive.

11. The method of claim 1 further comprising coating the first facet mirror with a material so that it is highly reflective.

12. The method of claim 1 further comprising coating the second facet mirror with an anti-reflection material at a single location.

13. The method of claim 1 wherein the step of depositing a first type of multiple quantum well material suitable for forming passive waveguides and a second type of multiquantum well material suitable for forming optical amplifiers further comprises depositing a guiding layer on the semiconductor substrate for vertical waveguiding, wherein the first and second type of multiple quantum well material is deposited within the guiding layer.

* * * * *